United States Patent
Chang et al.

(10) Patent No.: US 9,165,946 B1
(45) Date of Patent: Oct. 20, 2015

(54) DISPLAY PANEL AND ARRAY SUBSTRATE THEREOF

(71) Applicant: AU Optronics Corporation, Hsin-Chu (TW)

(72) Inventors: Wan-Heng Chang, Hsin-Chu (TW); Hsiao-Wei Cheng, Hsin-Chu (TW); Shih-Chyuan Fan Jiang, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 14/487,658

(22) Filed: Sep. 16, 2014

(30) Foreign Application Priority Data

May 16, 2014 (TW) .............................. 103117330 A

(51) Int. Cl.
  *H01L 27/14* (2006.01)
  *H01L 27/12* (2006.01)
  *H01L 29/786* (2006.01)

(52) U.S. Cl.
  CPC .......... *H01L 27/1222* (2013.01); *H01L 29/786* (2013.01); *H01L 27/1218* (2013.01)

(58) Field of Classification Search
  CPC .................................................. H01L 27/1218
  See application file for complete search history.

(56) References Cited

U.S. PATENT DOCUMENTS

| | | | |
|---|---|---|---|
| 6,788,357 B2 | 9/2004 | Moon | |
| 6,858,867 B2 | 2/2005 | Okumura | |
| 7,038,241 B2 | 5/2006 | Okumura | |
| 7,420,213 B2 * | 9/2008 | Chae et al. | 257/72 |
| 7,701,007 B2 | 4/2010 | Chen et al. | |
| 7,872,722 B2 | 1/2011 | Kimura | |
| 8,004,738 B2 * | 8/2011 | Yang et al. | 359/245 |
| 8,040,449 B2 * | 10/2011 | Seong et al. | 257/350 |
| 2005/0045885 A1 | 3/2005 | Kim et al. | |

* cited by examiner

*Primary Examiner* — Chandra Chaudhari
(74) *Attorney, Agent, or Firm* — WPAT, PC; Justin King

(57) ABSTRACT

An array substrate includes a scan line, a data line, a thin film transistor, a first transparent electrode, a passivation layer, and a second transparent electrode. The scan line and the data line interlace to define a pixel region. The gate dielectric layer of the thin film transistor overlaps the scan line and the data line and extends to cover the pixel region. The gate dielectric layer has a first region, a second region, and a third region. The first region corresponds to the semiconductor layer of the thin film transistor. The second region connects the first region and the third region. The thickness of the second region is different from that of the third region. The first transparent electrode covers the gate dielectric layer in the pixel region. The passivation layer covers the thin film transistor and the first transparent electrode. The second transparent electrode covers the passivation layer.

12 Claims, 9 Drawing Sheets

DISPLAY PANEL AND ARRAY SUBSTRATE THEREOF

RELATED APPLICATIONS

This application claims priority to Taiwan Application Serial Number 103117330, filed May 16, 2014, which are herein incorporated by reference.

BACKGROUND

Liquid crystal display (LCD) is the mainstream in the current display industry, and one of the issues that related industries wish to solve is that of poor viewing angles. Currently, in order to solve the issue of poor viewing angles, related industries have proposed various display technologies such as vertical alignment (VA), in-plane switching (IPS), and fringe-field switching (FFS).

FFS and IPS are two most popular wide viewing angle technologies, but compared to IPS, FFS has the characteristics of higher transmittance and larger viewing angle. In addition, FFS improves defects of IPS such as slow twist rate, low aperture ratio, need for more backlights as well. Therefore, FFS is becoming a rising star in wide viewing angle technology.

SUMMARY

This disclosure provides an array substrate applying fringe-field switching (FFS) technology.

In one embodiment, an array substrate is provided. The array substrate includes at least one scan line, at least one data line, at least one thin film transistor, at least one first transparent electrode, a passivation layer, and at least one second transparent electrode. The scan line and the data line interlace to define a pixel region. The thin film transistor has a gate, a source, a drain, a semiconductor layer, and a gate dielectric layer. The gate connects the scan line. The source connects the data line. The semiconductor layer is disposed between the source, the drain, and the gate. The source and the drain respectively contact two ends of the semiconductor layer. The gate dielectric layer is disposed between the semiconductor layer and the gate, overlaps both of the scan line and the data line, and extends to cover the pixel region. The gate dielectric layer has a first region, a second region, and a third region. At least partially of the first region is corresponding to the semiconductor layer, and the third region is corresponding to at least partially of the pixel region. The second region connects and is located between the first region and the third region. A thickness of the second region is different from a thickness of the third region. The first transparent electrode is disposed on and covers a part of the gate dielectric layer in the pixel region. The passivation layer is disposed on and covers the thin film transistor and the first transparent electrode. The second transparent electrode is disposed on and covers a part of the passivation layer. The second transparent electrode has at least one first edge electrode, at least one second edge electrode, a plurality of strip electrodes, and a plurality of gaps. The first edge electrode is substantially parallel to the data line and is located neighboring to the data line. The second edge electrode is substantially parallel to the scan line and is located neighboring to the scan line. The strip electrodes connect the first edge electrode, the second edge electrode, or both. Each of the gaps is located between each two of the adjacent strip electrodes. One of the first transparent electrode and the second transparent electrode is electrically connected to the drain as a pixel electrode, and the other of the first transparent electrode and the second transparent electrode is electrically connected to a common potential source as a common electrode.

In one or more embodiments, the strip electrodes connect the first edge electrode, the second region is located between the data line and the first transparent electrode, and the first transparent electrode partially overlaps the second region.

In one or more embodiments, a vertical projection distance between an inner edge of the first edge electrode and a boundary of the second region is from about 2 μm to about 8 μm.

In one or more embodiments, the second region is disposed between the scan line and the first transparent electrode, and the first transparent electrode partially overlaps the second region.

In one or more embodiments, a vertical projection distance between an inner edge of the second edge electrode and a boundary of the second region is from about 2 μm to about 8 μm.

In one or more embodiments, the strip electrodes connect the second edge electrode, the second region is located between the scan line and the first transparent electrode, and the first transparent electrode partially overlaps the second region.

In one or more embodiments, a vertical projection distance between an inner edge of the second edge electrode and a boundary of the second region is from about 2 μm to about 8 μm.

In one or more embodiments, a thickness of the first region and the thickness of the second region is greater than the thickness of the third region.

In one or more embodiments, a thickness of the first region and the thickness of the third region is smaller than the thickness of the second region.

In one or more embodiments, the second region is corresponding to the scan line except the scan line in the first region.

In one or more embodiments, a thickness difference between the second region and the third region is from about 1000 Å to 10000 Å.

In another aspect of this disclosure, a display panel including the aforementioned array substrate is provided.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

Figure 1:
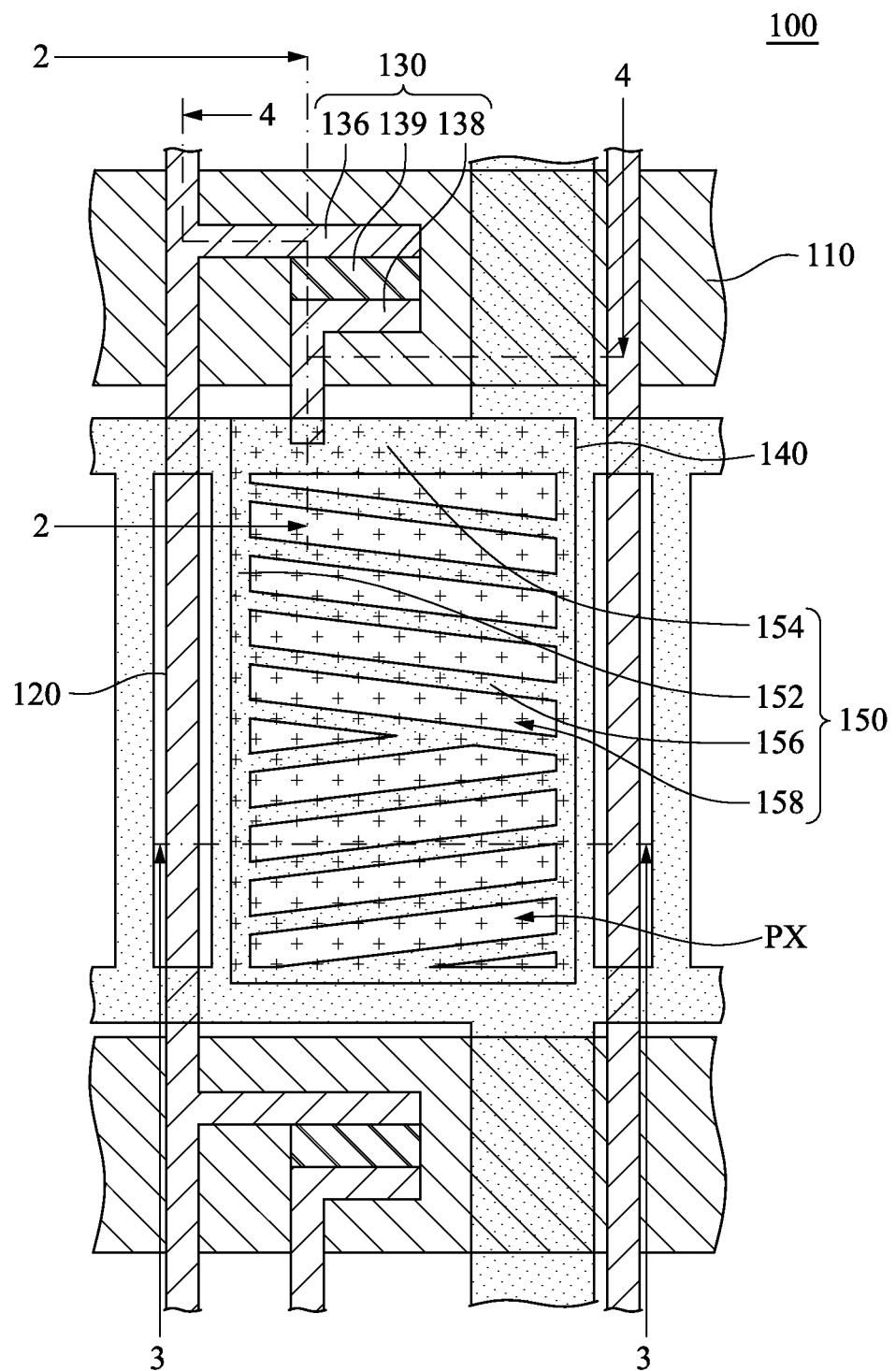
FIG. 1 is a partial top view of an array substrate according to the first embodiment of this disclosure.

FIG. 1 is a partial top view of an array substrate 100 according to the first embodiment of this disclosure. As shown in FIG. 1, an array substrate 100 is provided. The array substrate 100 includes at least one scan line (or namely gate line) 110, at least one data line 120, at least one thin film transistor 130, at least one first transparent electrode 140, a passivation layer 145 (shown in FIG. 2), and at least one second transparent electrode 150. The scan line 110 and the data line 120 interlace to define a pixel region PX.

Figure 2:
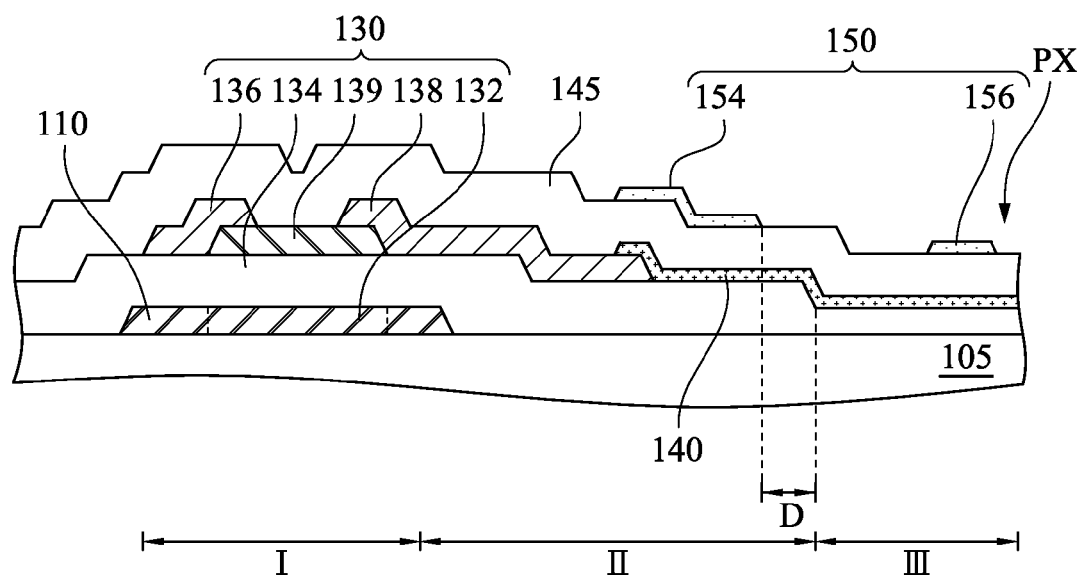
FIG. 2 is a cross-sectional view viewed along line 2 of FIG. 1.

FIG. 2 is a cross-sectional view viewed along line 2 of FIG. 1. As shown in FIG. 1 and FIG. 2, the thin film transistor 130 has a gate (gate electrode) 132, a source (source electrode) 136, a drain (drain electrode) 138, a semiconductor layer 139, and a gate dielectric layer (or namely gate insulation layer) 134. The gate 132 connects the scan line 110. The source 136 connects the data line 120. The semiconductor layer 139 is disposed between the source 136, the drain 138, and the gate 132. The source 136 and the drain 138 are separated from each other and respectively contact two ends of the semiconductor layer 139. The gate dielectric layer 134 is disposed between the semiconductor layer 139 and the gate 132 and extends to cover the pixel region PX. The first transparent electrode 140 is disposed on and covers a part of the gate dielectric layer 134 in the pixel region PX. The passivation layer 145 is disposed on and covers the thin film transistor 130 and the first transparent electrode 140. The second transparent electrode 150 is disposed on and covers a part of the passivation layer 145. In the embodiment, the first transparent electrode 140 is electrically connected to the drain 138 as a pixel electrode. The second transparent electrode 150 is electrically connected to a common potential source as a common electrode. The structure of the array substrate 100 in the embodiment means the upper of the common electrode and the below of the pixel electrode, or namely the common electrode is disposed on the pixel electrode and the pixel electrode is disposed below the common electrode.

The array substrate 100 may further include a substrate 105. The scan line 110, the data line 120, the thin film transistor 130, the first transparent electrode 140, the passivation layer 145, and the second transparent electrode 150 can all be formed on the substrate 105.

As shown in FIG. 1, the second transparent electrode 150 has at least one first edge electrode 152 (or namely first boundary electrode, or first fringe electrode), at least one second edge electrode 154 (or namely second boundary electrode, or second fringe electrode), a plurality of strip electrodes 156, and a plurality of gaps 158. The first edge electrode 152 is substantially parallel to the data line 120 and is located neighbor to the data line 120. The second edge electrode 154 is substantially parallel to the scan line 110 and is located neighbor to the scan line 110. The strip electrodes 156 connect the first edge electrode 152. Each of the gaps 158 is located between each two of the adjacent strip electrodes 156.

The strip electrodes 156 connected to the first edge electrode 152 has a connection portion, which may generate chaotic electric fields, so liquid crystal molecules may rotate in a chaotic manner. In some situations, liquid crystal molecules do not rotate in a plane parallel to the array substrate 100 but toward a direction perpendicular to the array substrate 100. The situation may generate a declination line, resulting in a loss of the liquid crystal efficiency.

Figure 3:
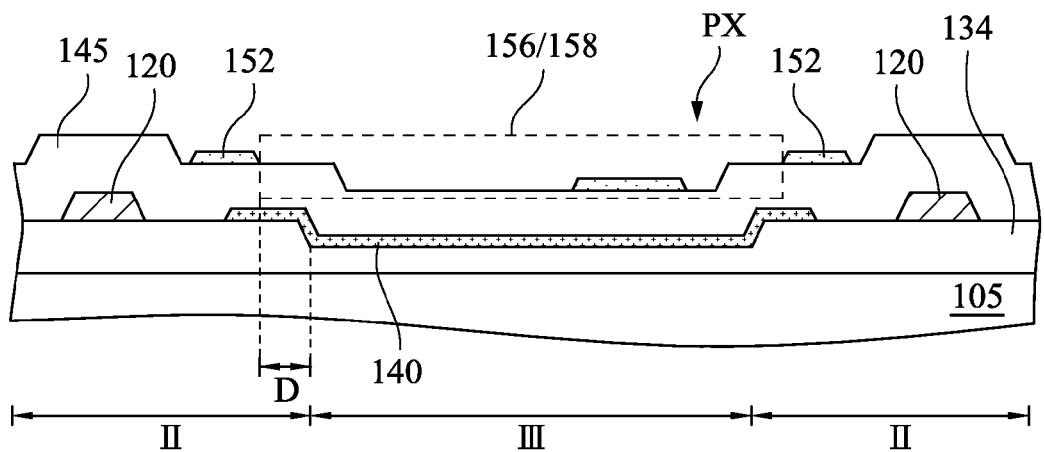
FIG. 3 is a cross-sectional view viewed along line 3 of FIG. 1.

In order to avoid the aforementioned issue, the gate dielectric layer with different thickness is adopted in the embodiment, and the chaotic rotations of liquid crystal molecules due to the chaotic electric fields is reduced by the terrain (or namely landform) of the gate dielectric layer. FIG. 3 is a cross-sectional view viewed along line 3 of FIG. 1. As shown in FIGS. 1 to 3, the gate dielectric layer 134 has a first region I, a second region II, and a third region III. At least partially of the first region I is corresponding to the semiconductor layer 139, and the third region III is corresponding to at least partially of the pixel region PX. The second region II connects and is located between the first region I and the third region II. A thickness of the second region II is different from a thickness of the third region III.

As shown in FIG. 3, in the embodiment, the second region II may be optically corresponding to between the data line 120 and the first transparent electrode 140, and the thickness of the third region III is smaller than that of the second region II. Then, the strip electrodes 156 connected to the first edge electrode 152 has a connection portion, i.e., a distance from an inner edge of the first edge electrode 152 to the first transparent electrode 140 becomes larger to reduce the magnitude of the electric fields distributed between the first transparent electrode 140 and the second transparent electrode 150. Therefore, the chaotic electric fields generated by the connection portion of the strip electrodes 156 connected to the first edge electrode 152 become smaller, and the situation about the chaotic rotations of the liquid crystal molecules is reduced.

In addition, as shown in FIG. 3, the gate dielectric layer 134 overlaps the data line 120. Specifically, the data line 120 may be disposed on and cover a part of the second region II of the gate dielectric layer 134.

Furthermore, the first transparent electrode 140 of the embodiment partially overlaps the second region II. Specifically, there are level differences (or namely height differences) between the second region II and the third region III. The first transparent electrode 140 may conformally cover the level differences, a part of the second region II near to the level differences, and all of the third region III.

In the embodiment, a vertical projection distance D is defined between the inner edge of the first edge electrode 152 and a boundary of the second region II. Because of the vertical projection distance D located between the inner edge of the first edge electrode 152 and the boundary of the second region II, the distance between the inner edge of the first edge electrode 152, i.e., the connection portion of the strip electrodes 156 and the first edge electrode 152, and the first transparent electrode 140 may be further lengthened to further improve the liquid crystal efficiency. In practice, the vertical projection distance D may be from about 2 micrometers (μm) to about 8 μm, specifically, from about 2 μm to about 6 μm, or, more specifically, from about 4 μm to about 6 μm.

The term "about" in the whole disclosure refers to the fact that embodiments having any tiny variations or modifications not affecting the essence of the technical features can be included in the scope of the present disclosure. For example, "the vertical projection distance D may be from about 2 μm to about 8 μm" means that the vertical projection distance D can be from 2 μm to 8 μm, slightly smaller than 2 μm, or slightly larger than 8 μm as long as the liquid crystal efficiency can be improved.

As shown in FIG. 2, the second region II may be optically disposed between the scan line 110 and the first transparent electrode 140. Similarly, a vertical projection distance D is defined between an inner edge of the second edge electrode 154 and the boundary of the second region II. In practice, the vertical projection distance D may be from about 2 μm to about 8 μm, specifically, from about 2 μm to about 6 μm, or, more specifically, from about 4 μm to about 6 μm.

Similarly, the first transparent electrode 140 of FIG. 2 partially overlaps the second region II. Specifically, there are height differences (or namely level differences) between the second region II and the third region III. The first transparent electrode 140 may conformally cover the height differences, a part of the second region II near to the height differences, and all of the third region III.

Though the strip electrodes 156 are defined to connect the first edge electrode 152 in the above description, it does not mean that the strip electrodes 156 connect only the first edge electrode 152. In fact, as shown in FIG. 1, a part of the strip electrodes 156 are connected to both the first edge electrode 152 and the second edge electrode 154. People having ordinary skill in the art can make proper modification on the strip electrodes 156 according to actual requirements.

Figure 4:
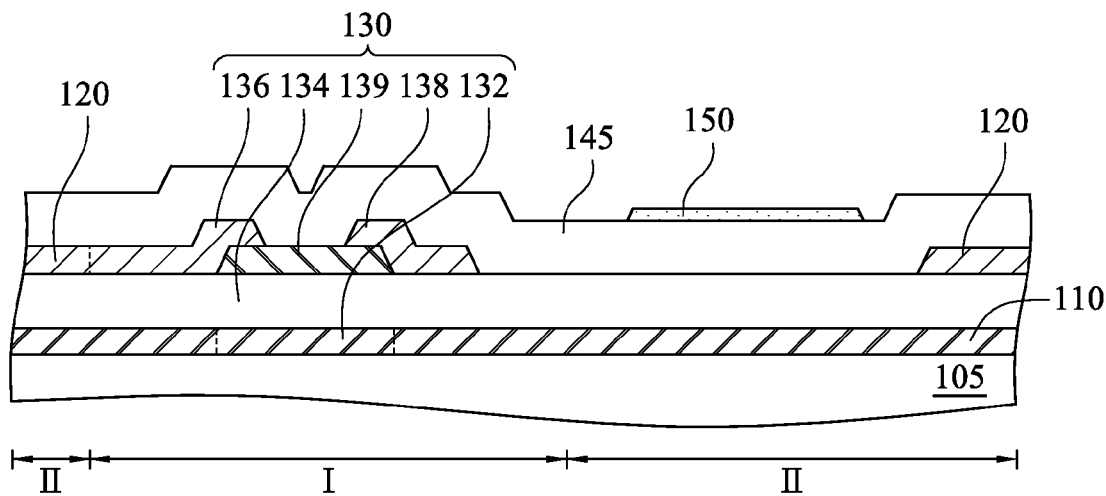
FIG. 4 is a cross-sectional view viewed along line 4 of FIG. 1.

FIG. 4 is a cross-sectional view viewed along line 4 of FIG. 1. As shown in FIG. 4, the aforementioned second region II may be optically corresponding to the scan line 110, such that the second region II is located between the scan line 110 and the second transparent electrode 150. Because the thickness of the second region II is grater than the thickness of the third region III (such as shown in FIG. 3), i.e., the second region II with the larger thickness is located between the scan line 110 and the second transparent electrode 150, parasitic capacitance between the scan line 110 and the second transparent electrode 150 is reduced to prevent any lack of ability to charge due to a higher resistor-capacitor loading (or namely RC loading).

Furthermore, the above-mentioned second region II may be further located between the scan line 110 and the data line 120. Because the second region II with the larger thickness is located between the scan line 110 and the data line 120, parasitic capacitance between the scan line 110 and the data line 120 is reduced to prevent any lack of ability to charge due to a higher resistor-capacitor loading.

In addition, a thickness of the first region I may be greater than the thickness of the third region III (as shown in FIG. 2). Because the first region I with the larger thickness is located between the gate 132 and the semiconductor layer 139, the gate 132 and the source 136, and the gate 132 and the drain 138, parasitic capacitances between the gate 132 and the semiconductor layer 139, the gate 132 and the drain 136, and the gate 132 and the drain 138 can be reduced to prevent any lack of ability to charge due to a higher resistor-capacitor loading.

Furthermore, as shown in FIG. 4, the gate dielectric layer 134 overlaps the scan line 110. Specifically, the first region I and the second region II of the gate dielectric layer 134 are both corresponding to the scan line 110, i.e., the first region I and the second region II of the gate dielectric layer 134 may both cover the scan line 110. As shown in FIG. 3 and FIG. 4, the gate dielectric layer 134 may overlap both of the scan line 110 and the data line 120.

In the embodiment, the different thicknesses of the first region I, the second region II, and the third region III may be formed by performing at least one additional lithography and etching processes. Specifically, assuming that the thickness of the third region III is smaller and the thicknesses of the first region I and the second region II are larger, a thin region (or the third region III) and the thick region (or the first region I and the second region II) may be designed by the lithography process, and then the thickness of the thin region (or the third region III) may be decreased by the etching process. Or, a first dielectric layer may be formed on the array substrate 100, and the first dielectric layer in the thin region (or the third region III) is removed by the lithography and etching processes. Then, a second dielectric layer covers the first dielectric layer and the thin region (or the third region III). The region where the first dielectric layer and the second dielectric layer overlaps becomes the thick region (or the first region I and the second region II), and the thin region (or the third region III) has a smaller thickness than that of the thick region (or the first region I and the second region II) because there is only the second dielectric layer in the thin region. At this time, the gate dielectric layer 134 is formed by the first dielectric layer and the second dielectric layer, while the gate dielectric layer 134 in the thin region is formed by only one of the first dielectric layer and the second dielectric layer, and the gate dielectric layer 134 in the thick region is formed by the first dielectric layer and the second dielectric layer.

In the embodiment, the thickness of the first region I may be substantially the same as the thickness of the second region II, and the thicknesses of the first region I and the second region II may both be greater than the thickness of the third region III to simplify the processes, prevent any lack of ability to charge, and the declination line issue. The thicknesses of the first region I, the second region II, and the third region III may be different, and people having ordinary skill in the art can make proper modification on the thicknesses of the first region I, the second region II, and the third region III according to actual requirements.

In the embodiment, the difference in thickness between the first region I and/or the second region II, and the third region III may be from about 1000 Å to about 10000 Å, but not limited it.

A thickness of the first region I and/or the second region II may be from about 4000 Å to about 10000 Å, but not limited it In the embodiment, the substrate 105 may be a rigid substrate or a flexible substrate. The rigid substrate may be a glass substrate as an example, but not limited it. The flexible substrate may be a polyimide (PI) substrate as an example, but not limited it.

Materials of the scan line 110, the gate 132, the data line 120, the source 136, and the drain 138 may be any conductor, such as titanium, molybdenum, chromium, iridium, aluminum, copper, silver, gold, graphene, carbon nanotube, or any combination of the above. The formation method may be thin film deposition, lithography, and etching processes. Specifically, the thin film deposition process may be physical vapor deposition such as sputtering or other suitable processes such as screen printing, spin coating, ink jet, etc.

Materials of the gate dielectric layer 134 and the passivation layer 145 may be any dielectric material, such as silicon nitride, silicon oxide, silicon oxynitride, graphene oxide, graphene nitride, graphene oxynitride, or any combination of the above. The formation method may be by thin film deposition, lithography, or etching processes.

A material of the semiconductor layer 139 may be any semiconductor material, such as amorphous silicon, polycrystalline silicon, monocrystalline silicon, oxide semiconductor, graphene, or any combination of the above. The formation method may be thin film deposition, lithography, and etching processes.

Materials of the first transparent electrode 140 and the second transparent electrode 150 may be any transparent conductive material, such as indium tin oxide, indium zinc oxide, zinc aluminum oxide, graphene, carbon nanotube, or any combination of the above. The formation method may be by thin film deposition, lithography, or etching processes.

Figure 5:
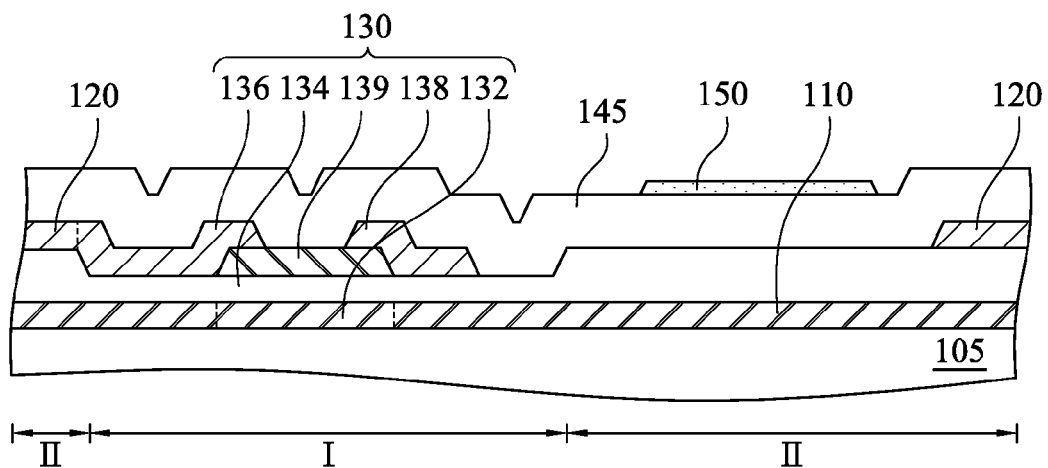
FIG. 5 is a partial cross-sectional view of the array substrate according to the second embodiment of this disclosure, in which the position of the section is the same as FIG. 4.

FIG. 5 is a partial cross-sectional view of the array substrate 100 according to the second embodiment of this disclosure, in which the position of the section is the same as FIG. 4. The difference between the present embodiment and the first embodiment is that the thickness of the first region I of the embodiment is smaller than the thickness of the second region II. The second region II may be further optically corresponding to the scan line 110 except the scan line 110 in the first region I, i.e., the first region I is corresponding to a place has the semiconductor layer 139, and the place also has a part of the scan line 110 or/and a part of the gate 132. In addition, except the thickness of the gate dielectric layer 134 in the first region I, the thickness of the gate dielectric layer 134 in the second region II may be selectively adopted. In the present embodiment, because the first region I disposed between the gate 132 and the semiconductor layer 139 has a smaller thickness, the carrier mobility of the semiconductor layer 139 is increased, and thus the efficiency of the thin film transistor 130 is enhanced as well.

In the present embodiment, the thicknesses of the first region I and the third region III may be substantially the same, and the thicknesses of the first region I and the third region III are both smaller than that of the second region II, to simplify the processes, prevent declination line issue, increase the carrier mobility of the semiconductor layer 139, and thus enhance the efficiency of the thin film transistor 130. The first region I, the second region II, and the third region III may have different thicknesses, and people having ordinary skill in the art can make proper modifications upon the first region I, the second region II, and the third region III according to actual requirements.

The other associate structures and details of the embodiment are the same as those of the first embodiment, so they will not be repeated in the following.

Figure 6:
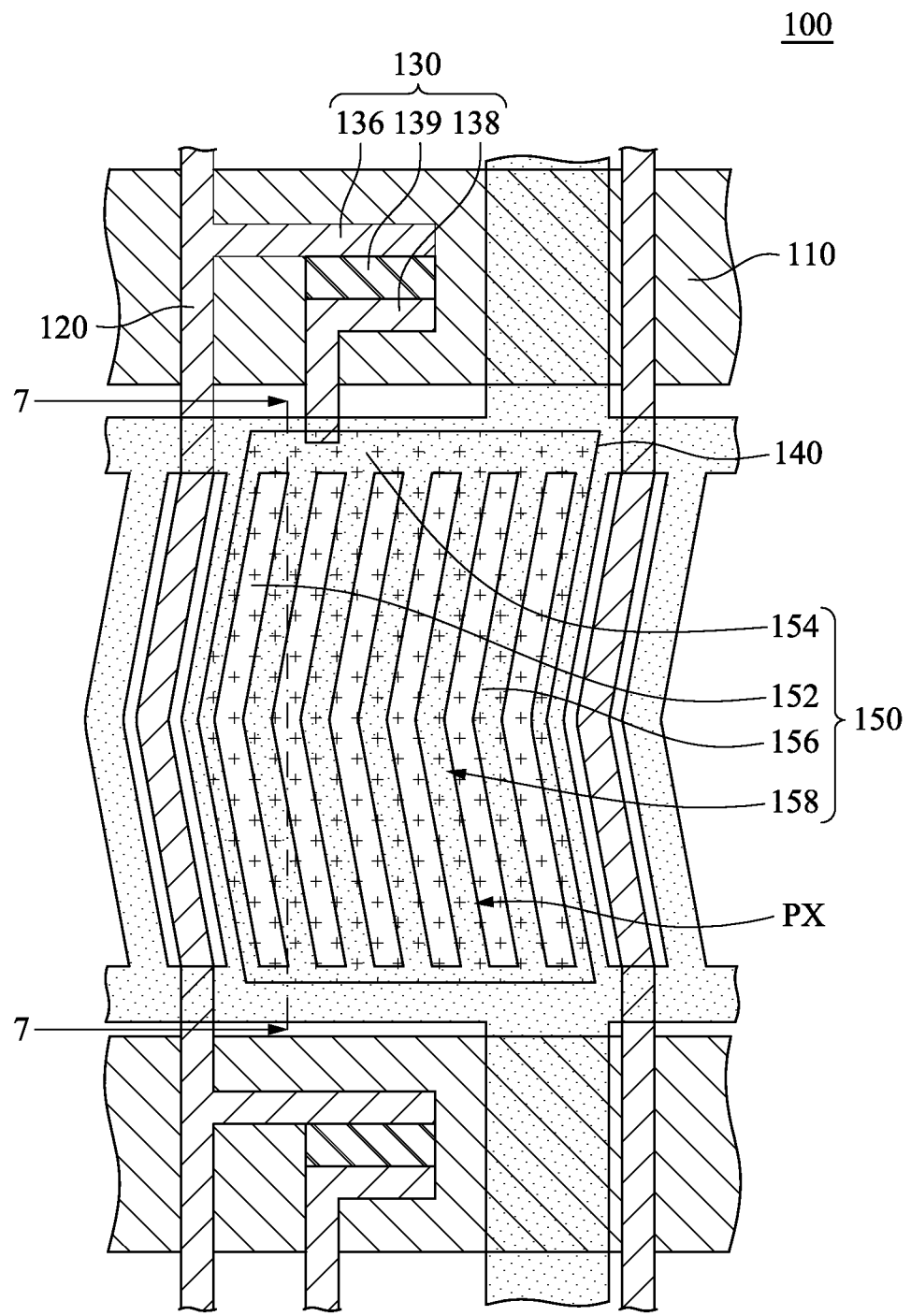
FIG. 6 is a partial top view of the array substrate according to the third embodiment of this disclosure.

FIG. 6 is a partial top view of the array substrate 100 according to the third embodiment of this disclosure. The difference between the embodiment and the first embodiment or the second embodiment is that the liquid crystal alignment direction of the present embodiment is different from that of the first embodiment or the second embodiment. And, the extend direction of the strip electrodes 156 in the present embodiment is also different from the first embodiment or the second embodiment. In the present embodiment, the strip electrodes 156 connect the second edge electrode 154, and the second edge electrode 154 is substantially parallel to the scan line 110 and located neighboring to the scan line 110. Similarly, the connection portion of the strip electrodes 156 and the second edge electrode 154 generates chaotic electric fields, so liquid crystal molecules may rotate in a chaotic manner.

Figure 7:
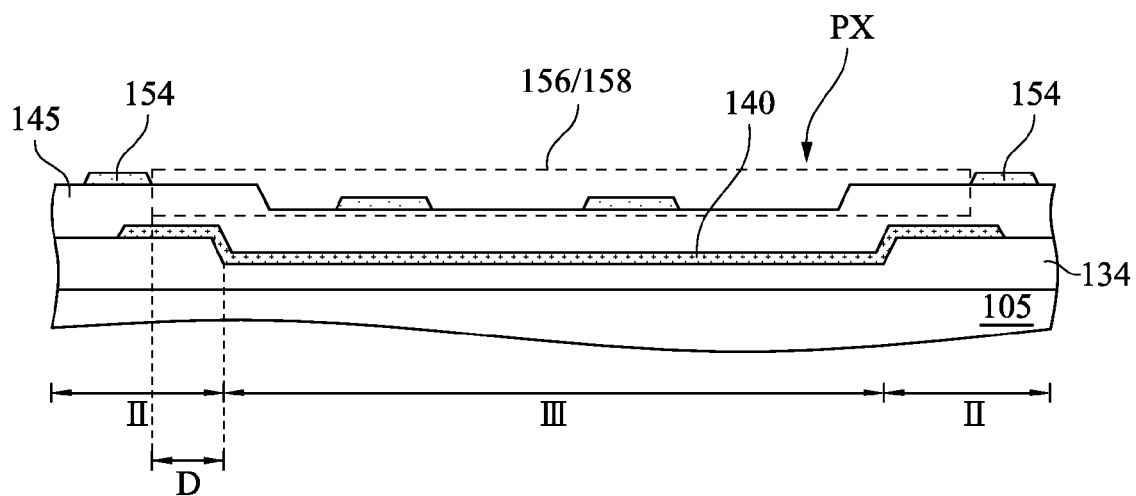
FIG. 7 is a cross-sectional view viewed along line 7 of FIG. 6.

Similarly, the gate dielectric layer with different thicknesses is adopted in the embodiment, and the chaotic rotations of the liquid crystal molecules due to the chaotic electric fields are reduced by the terrain of the gate dielectric layer. FIG. 7 is a cross-sectional view viewed along line 7 of FIG. 6. As shown in FIG. 6 and FIG. 7, in the embodiment, the second region II is optically disposed between the scan line 110 and the first transparent electrode 140, and the thickness of the third region III is smaller than the thickness of the second region II. Then, a distance between the connection portion of the strip electrodes 156 and the second edge electrode 154, i.e., the inner edge of the second edge electrode 154, and the first transparent electrode 140 becomes larger. Therefore, the chaotic electric fields generated by the connection portion of the strip electrodes 156 and the second edge electrode 154 become smaller, and the situation about the chaotic rotations of the liquid crystal molecules is reduced.

In the embodiment, a vertical projection distance D is defined between the inner edge of the second edge electrode 154 and the boundary of the second region II. Because of the vertical projection distance D located between the inner edge of the second edge electrode 154 and the boundary of the second region II, the distance between the inner edge of the second edge electrode 154, i.e., the connection portion of the strip electrodes 156 and the second edge electrode 154, and the first transparent electrode 140 is further lengthened to further improve the liquid crystal efficiency. In practice, the vertical projection distance D may be from about 2 μm to about 8 μm, specifically, from about 2 μm to about 6 μm, or, more specifically, from about 4 μm to about 6 μm.

The other associate structures and details of the embodiment are the same as those of the first embodiment or the second embodiment. For example, the thicknesses of the first region I and the second region II are greater than that of the third region III in the first embodiment, or the thicknesses of the first region I and the third region III are smaller than that of the second region II in the second embodiment. Therefore, the other associate structures and details of the embodiment will not be repeated in the following.

Figure 8:
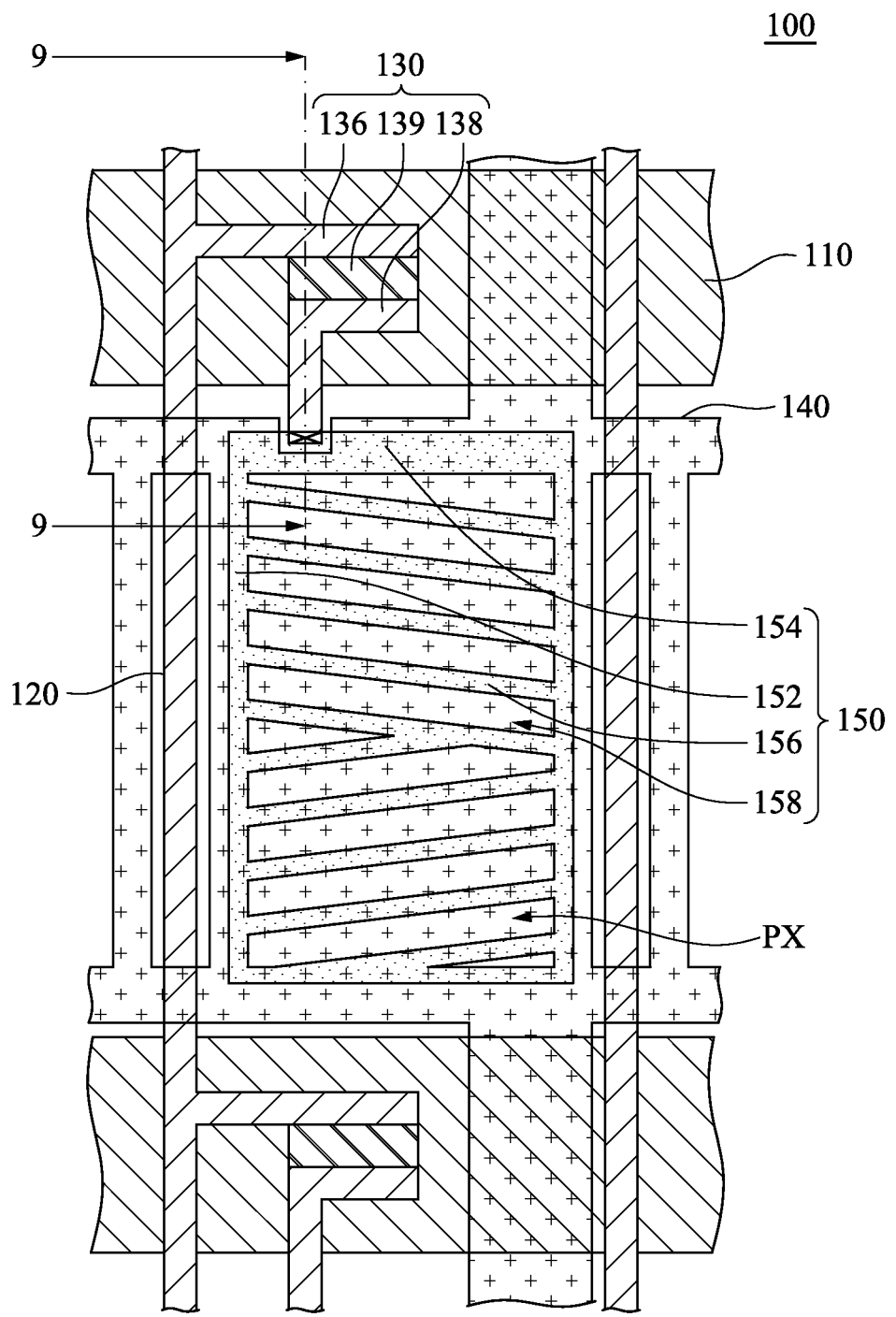
FIG. 8 is a partial top view of the array substrate according to the fourth embodiment of this disclosure.
Figure 9:
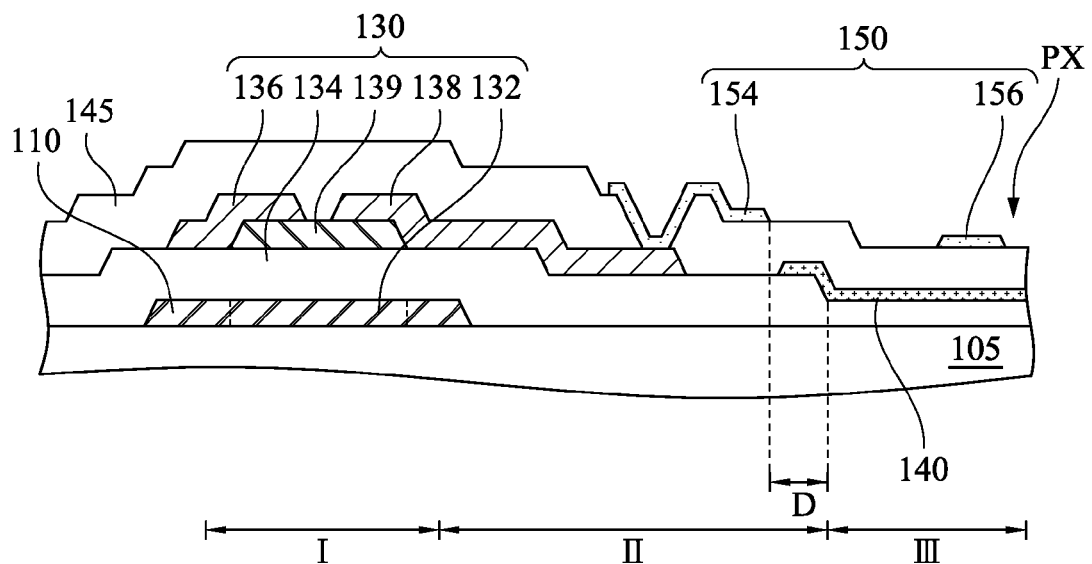
FIG. 9 is a cross-sectional view viewed along line 9 of FIG. 8.

FIG. 8 is a partial top view of the array substrate 100 according to the fourth embodiment of this disclosure. FIG. 9 is a cross-sectional view viewed along line 9 of FIG. 8. The difference between the embodiment and the first embodiment/the second embodiment is that the second transparent 150 is electrically connected to the drain 138 as a pixel electrode, and the first transparent electrode 140 is electrically connected to a common potential source as a common electrode. The structure of the array substrate 100 in the embodiment means the upper of the pixel electrode and the below of the common electrode, or namely the pixel electrode is disposed on the common electrode and the common electrode is disposed below the pixel electrode.

The other associated structures and details of the embodiment are the same as those of the first embodiment, the second embodiment or the third embodiment. For example, the thicknesses of the first region I and the second region II are greater than that of the third region III in the first embodiment, the thicknesses of the first region I and the third region III are smaller than the thickness of the second region II in the second embodiment, or the strip electrodes 156 connect the second edge electrode 154 and the second edge electrode 154 is substantially parallel to the scan line 110 and located neighboring to the scan line 110 in the third embodiment. Therefore, the other associated structures and details of the embodiment will not be repeated in the following.

Figure 10:
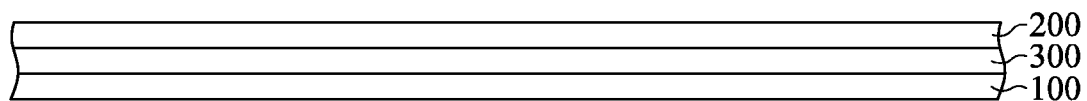
FIG. 10 is a schematic cross-sectional view of a display panel according to one embodiment of this disclosure.

FIG. 10 is a schematic cross-sectional view of a display panel according to one embodiment of this disclosure. As shown in FIG. 10, the array substrate 100 in the aforementioned various embodiments may be applied in a display panel. Specifically, the display panel includes the array substrate 100, an opposite substrate 200, and a non-self-luminous display medium layer 300 such as a liquid crystal layer. The opposite substrate 200 is disposed above the array substrate 100. The non-self-luminous display medium layer 300 is sandwiched between the array substrate 100 and the opposite substrate 200. In addition, the thin film transistor 130 in the aforementioned embodiments (the first to the fourth embodiments) uses a bottom gate structure as an example. Specifically, the semiconductor layer 139 is disposed above the gate 132, and the gate dielectric layer 134 is disposed between the semiconductor layer 139 and the gate 132. Embodiments of this disclosure are not limited thereto. In other embodiment, the thin film transistor 130 in the aforementioned embodiments (the first to the fourth embodiments) may use a top gate structure. For example, the semiconductor layer 139 is disposed below the gate 132, and the gate dielectric layer 134 is disposed between the semiconductor layer 139 and the gate 132. At least one of the planar shape of the gaps 158, the strip electrodes 156, the first edge electrode 152, and the second edge electrode 154 may be a polygon, such as a rectangle, a curved shape, a triangular, a serrated shape, or other suitable shapes. One of the first transparent electrode 140 and the second transparent electrode 150 of the aforementioned embodiments (the first to the fourth embodiments) is a plate electrode, or namely an unpatterned electrode (such as an electrode without gaps 158), and the other of the transparent electrode 140 and the second transparent 150 is a patterned electrode (for example, strip electrodes 156 with gaps 158 therebetween). Embodiments of this disclosure are not limited thereto. In other embodiments, the first transparent electrode 140 and the second transparent electrode 150 in the aforementioned embodiments (the first to the fourth embodiments) are all patterned electrodes with gaps 158. Specifically, the strip electrodes 156 of the first transparent electrode 140 and the strip electrodes 156 of the second transparent electrode 150 staggered arrangement, i.e., the gaps 158 of the first transparent electrode 140 expose the strip electrode 156 of the second transparent electrode 150 in the vertical projection direction, and the gaps 158 of the second transparent electrode 150 expose the strip electrode 156 of the first transparent electrode 140 in the vertical projection direction.

Various working examples are disclosed in the following to describe that the array substrate in the aforementioned embodiments indeed provides the required performance. The parameters mentioned in the aforementioned embodiments will not be repeated in the following, and only what needs to be further defined will be supplemented.

Figure 11:
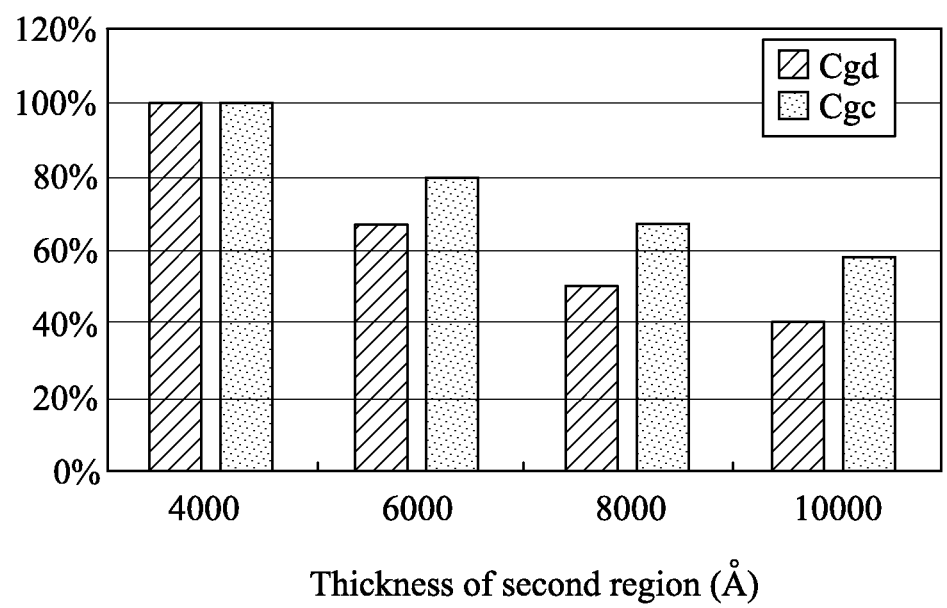
FIG. 11 is a histogram of parasitic capacitances according to various working examples of this disclosure.

FIG. 11 is a histogram of parasitic capacitances according to various working examples of this disclosure. As shown in FIG. 11, each working example adopts the array substrate 100 of the first embodiment as an example. The horizontal axis represents the thickness of the second region II, and the vertical axis represents the normalized parasitic capacitance. Specifically, in FIG. 11, the working example in which the thickness of the second region II is about 4000 Å is taken as the standard, the value of the parasitic capacitance of the working example is 100%, the value of the parasitic capacitances of the other working examples are ratios compared to the standard, and the ratio (normalized parasitic capacitance) is not unit. In addition, in FIG. 11, Cgc represents the parasitic capacitance between the scan line 110 and the second transparent electrode 150, and Cgd represents the parasitic capacitance between the scan line 110 and the data line. As shown in FIG. 11, the parasitic capacitance between the scan line 110 and the second transparent electrode 150 or the parasitic capacitance between the scan line 110 and the data line 120 decreases as the thickness of the second region II increases. However, the thickness of the second region II cannot increase without limitation. If the thickness of the second region II is too large, many process defects may be generated (the processes become more difficult) and the yield declines, resulting in the decreased transmittance of the pixel region PX and producing a color shift. Accordingly, the numerical values disclosed here are in the preferred range.

Figure 12:
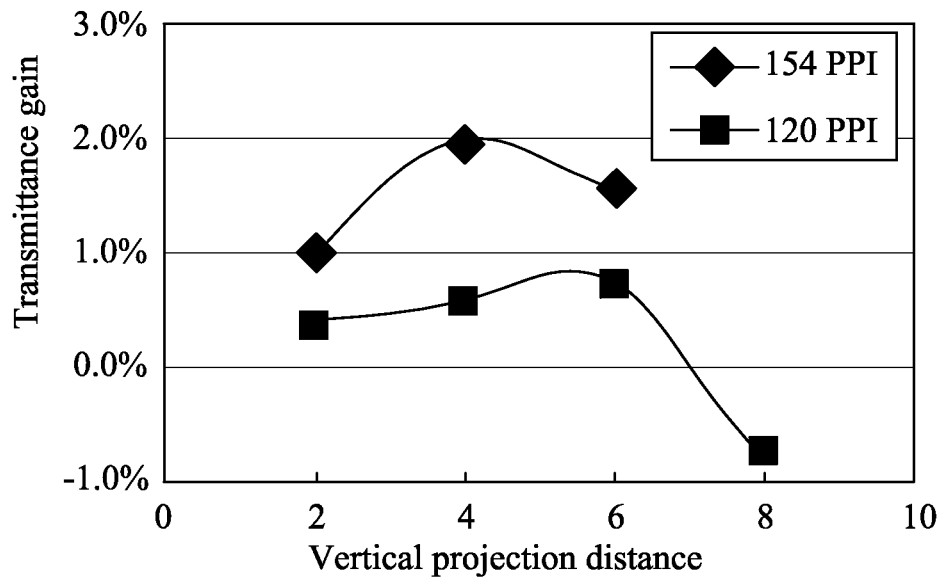
FIG. 12 illustrates transmittance gain curves according to various working examples of this disclosure.

FIG. 12 illustrates transmittance gain curves according to various working examples of this disclosure. As shown in FIG. 12, each working example adopts the array substrate 100 of the first embodiment as an example. The horizontal axis represents the vertical projection distance D between the inner edge of the first edge electrode 152 and the boundary of the second region II, and the vertical axis represents the transmittance gain, which is unitless (not unit) and is in the visible light band. In addition, the curve with marks ♦ represents data of the working example with 154 pixels per inch (PPI), and the curve with marks ■ represents data of the working example with 120 PPI. As shown in FIG. 12, generally speaking, when the vertical projection distance D is from about 2 μm to about 8 μm, transmittance is obviously improved. In the range of the vertical projection distance D, it can be found that transmittance has its best design value as the PPI becomes different. However, when the vertical projection distance D is larger than about 8 μm, the electric fields may be too small and can not drive the liquid crystal molecules to rotate, such that the overall transmittance significantly declines. When the vertical projection distance D is smaller than about 2 μm, the transmittance gain are not generated, and an adverse effect may even be produced. Therefore, the vertical projection distance D has a limited design range.

Figure 13:
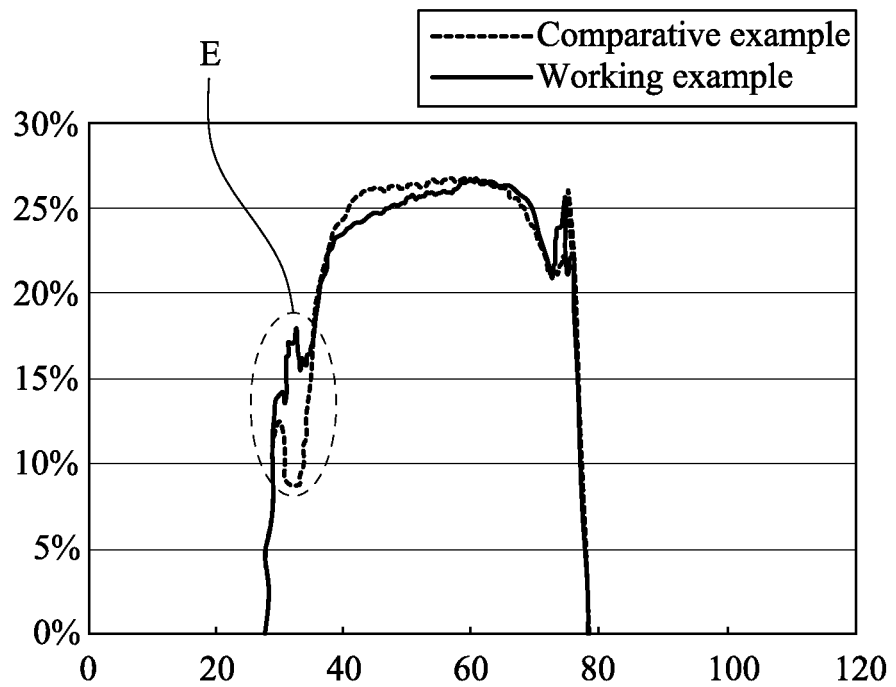
FIG. 13 illustrates transmittance curves of a liquid crystal layer according to a working examples and a comparative example of this disclosure.

FIG. 13 illustrates transmittance curves of the liquid crystal layer according to a working examples and a comparative example of this disclosure. As shown in FIG. 13, the working example adopts the array substrate 100 of the first embodiment as an example. The difference between the working example and the comparative example that the gate dielectric layer of the array substrate: the comparative example has the same thickness in different regions, and other parameters of the comparative example are the same as those of the working example. The horizontal axis represents the position along the line 3 of FIG. 1 with respect to the data line 120, and each unit of the horizontal axis is about 0.5 μm. There are 120 units in the horizontal axis, so the section length of FIG. 13 is about 60 μm. The vertical axis represents the transmittance of the liquid crystal layer in each unit length. For the region with zero transmittance of the liquid crystal layer, the region is blocked by the black matrix, so the transmittance of the liquid crystal layer can not be measured. The transmittance is unitless and in the visible light band. In addition, in FIG. 13, data of the working example is recorded as a solid line, data of the comparative example is recorded as a dashed line. As shown in FIG. 13, in the connection portion of the strip electrode 156 and the first edge electrode 152 (as shown in a circle E), the transmittance of the liquid crystal layer in the boundary of the pixel region PX in the comparative example is lower (bad), so efficiency (ability) of liquid crystals in the boundary of the pixel region PX of the comparative example is unobvious (not clear), and an blurred grayscale difference in the boundary of the pixel region PX. The working example has a better transmittance of the liquid crystal layer, so efficiency (ability) of liquid crystals in the boundary of the pixel region PX of the working example is clearness (obvious), and an obvious (clear) grayscale difference in the boundary of the pixel region PX.

All the features disclosed in this specification (including any accompanying claims, abstract, and drawings) may be replaced by alternative features serving the same, equivalent or similar purposes, unless expressly stated otherwise. Thus, unless expressly stated otherwise, each feature disclosed is one example only of a generic series of equivalent or similar features.

What is claimed is:

1. An array substrate, comprising:
   at least one scan line;
   at least one data line, wherein the scan line and the data line interlace to define a pixel region;
   at least one thin film transistor having a gate, a source, a drain, a semiconductor layer, and a gate dielectric layer, wherein the gate connects the scan line, the source connects the data line, the semiconductor layer is disposed between the source, the drain, and the gate, the source and the drain respectively contact two ends of the semiconductor layer, the gate dielectric layer is disposed between the semiconductor layer and the gate, overlaps both of the scan line and the data line, and extends to cover the pixel region, wherein the gate dielectric layer has a first region, a second region, and a third region, at least partially of the first region is corresponding to the semiconductor layer, the third region is corresponding to at least partially of the pixel region, the second region connects and is located between the first region and the third region, and a thickness of the second region is different from a thickness of the third region;
   at least one first transparent electrode disposed on and covering a part of the gate dielectric layer in the pixel region;
   a passivation layer disposed on and covering the thin film transistor and the first transparent electrode; and
   at least one second transparent electrode disposed on and covering a part of the passivation layer, wherein the second transparent electrode has at least one first edge electrode, at least one second edge electrode, a plurality of strip electrodes, and a plurality of gaps, the first edge electrode is substantially parallel to the data line and is located neighbor to the data line, the second edge electrode is substantially parallel to the scan line and is located neighbor to the scan line, the strip electrodes connect the first edge electrode, the second edge electrode, or both, each of the gaps is located between each two of the adjacent strip electrodes, one of the first transparent electrode and the second transparent electrode is electrically connected to the drain as a pixel electrode, and the other of the first transparent electrode and the second transparent electrode is electrically connected to a common potential source as a common electrode.

2. The array substrate of claim 1, wherein the strip electrodes connect the first edge electrode, the second region is located between the data line and the first transparent electrode, and the first transparent electrode partially overlaps the second region.

3. The array substrate of claim 2, wherein a vertical projection distance between an inner edge of the first edge electrode and a boundary of the second region is from about 2 μm to about 8 μm.

4. The array substrate of claim 2, wherein the second region is located between the scan line and the first transparent electrode, and the first transparent electrode partially overlaps the second region.

5. The array substrate of claim 4, wherein a vertical projection distance between an inner edge of the second edge electrode and a boundary of the second region is from about 2 μm to about 8 μm.

6. The array substrate of claim 1, wherein the strip electrodes connect the second edge electrode, the second region is located between the scan line and the first transparent electrode, and the first transparent electrode partially overlaps the second region.

7. The array substrate of claim 6, wherein a vertical projection distance between an inner edge of the second edge electrode and a boundary of the second region is from about 2 μm to about 8 μm.

8. The array substrate of claim 1, wherein a thickness of the first region and the thickness of the second region is greater than the thickness of the third region.

9. The array substrate of claim 1, wherein a thickness of the first region and the thickness of the third region is smaller than the thickness of the second region.

10. The array substrate of claim 1, wherein the second region is corresponding to the scan line except the scan line in the first region.

11. The array substrate of claim 1, wherein a thickness difference between the second region and the third region is from about 1000 Å to about 10000 Å.

12. A display panel, comprising:
    an array substrate of claim 1;
    an opposite substrate disposed above the array substrate; and
    a non-self-luminous display medium layer sandwiched between the array substrate and the opposite substrate.

* * * * *